United States Patent [19]

Kasai et al.

[11] 4,120,042
[45] Oct. 10, 1978

[54] MAGNETIC BUBBLE INFORMATION WRITING DEVICE

[75] Inventors: Masuo Kasai, Kokubunji; Shigeru Yoshizawa, Tokorozawa; Minoru Hiroshima, Mobara, all of Japan

[73] Assignee: Hitachi, Ltd., Japan

[21] Appl. No.: 731,317

[22] Filed: Oct. 12, 1976

Related U.S. Application Data

[63] Continuation-in-part of Ser. No. 612,430, Sep. 11, 1975.

[30] Foreign Application Priority Data

Sep. 11, 1974 [JP] Japan .............................. 49-103914
Mar. 28, 1975 [JP] Japan ................................ 50-36735

[51] Int. Cl.² ........................................... G11C 19/00
[52] U.S. Cl. .......................................... 365/2; 365/7; 365/11; 365/22
[58] Field of Search ............. 340/174 TF, 5 R, 5 BG; 365/2, 7, 11, 22

[56] References Cited

U.S. PATENT DOCUMENTS

| | | | |
|---|---|---|---|
| 3,599,190 | 8/1971 | Smith | 340/174 BG |
| 3,753,250 | 8/1973 | Yamauchi | 340/174 TF |
| 3,778,789 | 12/1973 | Watanabe | 340/174 TF |
| 3,803,591 | 4/1974 | Watanabe | 340/174 BG |
| 3,810,133 | 5/1974 | Bobeck | 340/174 BG |
| 3,820,089 | 6/1974 | Lama | 340/174 TF |
| 3,820,091 | 6/1974 | Kohara | 340/174 TF |
| 3,895,363 | 7/1975 | Braginski et al. | 340/174 TF |
| 3,971,005 | 7/1976 | Buhrer | 340/174 TF |

OTHER PUBLICATIONS

Operational Char. of 10³-Bit Garnet Y-Bar Shift Register, Danylchuk; Jour. App. Phys, vol. 42, #4, pp. 1358-1359, 3/15/71.

*Primary Examiner*—Marshall M. Curtis
*Attorney, Agent, or Firm*—Craig & Antonelli

[57] ABSTRACT

A magnetic bubble information writing device capable of carrying out writing without erasing old information representing either "0" or "1" at a location, where new information is to be written, by means of only a single hairpin-like conductor loop is disclosed, in which the single hairpin-like conductor loop is disposed at a projecting portion of permalloy patterns, enclosing the portion.

8 Claims, 15 Drawing Figures

MAGNETIC BUBBLE INFORMATION WRITING DEVICE

This is a continuation-in-part application of U.S. patent application, Ser. No. 612,430, filed Sept. 11, 1975, for which filing date the benefit of the common subject matter herewith is expressly claimed.

BACKGROUND OF THE INVENTION

1. Field of the Invention

This invention relates to a magnetic bubble information writing device, and more particularly, it relates to an information writing device capable of writing new information without erasing old one.

2. Description of the Prior Art

In has been known that electric current through a conductor loop disposed on a sheet of magnetic material can nucleate a bubble domain with a bias field substantially normal to the plane of the sheet, magnetic patterns of high permeability disposed on a surface of the sheet, and a rotating magnetic field which is parallel to the surface of the sheet. To nucleate the bubble domain, the electric current flows through the conductor loop, of course, in such a direction that a magnetic field produced by the electric current has an opposite direction to that of the bias field. To annihilate the bubble domain, the direction is reversed, i.e. an electric furrent flows through the conductor loop in such a direction that a magnetic field produced by the electric current strengthen the bias field. In a magnetic information storage device, the presence and absence of the bubble domain corresponds to a digital information, e.g. "1" and "0", respectively.

A conventional magnetic bubble information writing device consisting of the conductor loop was always preceded by an information erasing device just as a magnetic tape recorder. That is, the erasing device annihilates all the bubbles belonging to an old information and in the writing device an electric current flows always in a predetermined direction, and the presence and absence of the electric current corresponds to the digital information to be written. This writing system has an disadvantage that it is so complicated that external leads decrease the reliability of the information storage device and that operating margin is also decreased. Another fault is that the cycle time of the writing operation is relatively long.

SUMMARY OF THE INVENTION

The object of the present invention is therefore to provide an improved magnetic bubble information writing device capable of erasing old information and writing new information by one step, by means of a single conductor loop.

This invention provides a magnetic bubble information writing device which comprises a sheet of magnetic material in which single wall domains can be propagated, said material having a preferred direction of magnetization substantially normal to the plane of said sheet, means for providing a bias field substantially normal to the plane of said sheet, magnetic layer patterns adjacent to said sheet for defining a propagation channel for domains in said sheet, means for generating a magnetic field rotating through 360 degrees in the plane of said sheet, and a single hairpin-like conductor loop disposed on a projecting portion of said magnetic layer patterns, enclosing only the portion wherein the generating and annihilating operations of a magnetic bubble are done by a current introduced into the conductor loop in one direction or the other according to information to be written without regarding information to be erased.

This invention is based pricipally on a discovery of the inventors that the conductor loop used as a generator may be common with that used as an annihilator and that in case there exists already a bubble domain belonging to the old information to be erased when a bubble generating current flows through the conductor loop, the old bubble domain prevents nucleation of new one, so that there exists only one bubble domain also after a writing operation.

DESCRIPTION OF THE PREFERRED EMBODIMENTS

Figure 1:
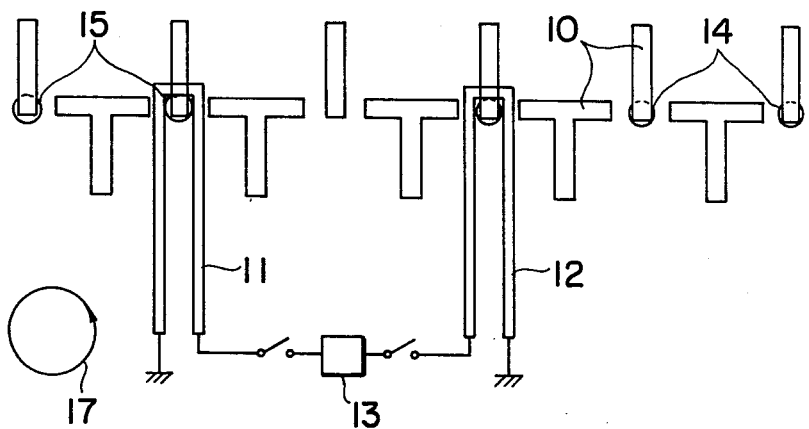
FIG. 1 is a schematic construction diagram of a conventional magnetic bubble information writing device.

For a better understanding of the present invention, a prior art will be described with reference to FIG. 1, in which the reference numeral 10 designated T bar patterns, 11 and 12 a conductor loop for a generator and that for an annihilator, respectively, 13 a pulse power source, 14 and 15 magnetic bubbles. The reference numeral 17 represents an in-plane rotating magnetic field. The operation of this device is the same as that described before.

The present invention will be explained below in detail.

Figure 2:
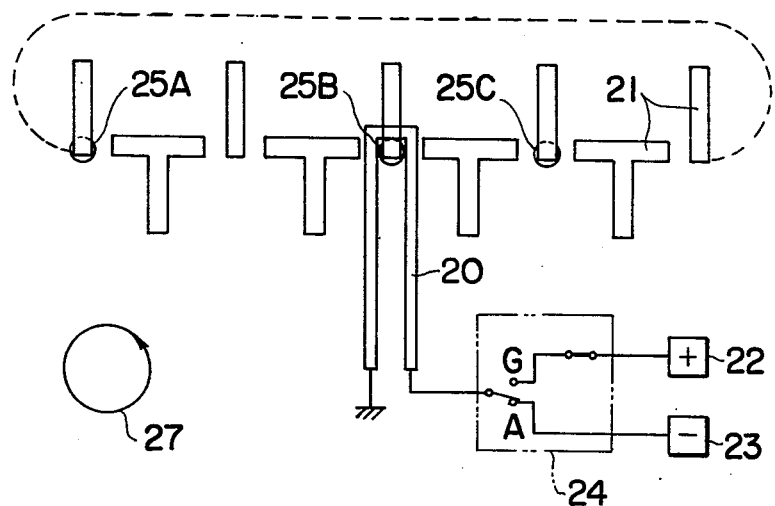
FIG. 2 is a view similar to FIG. 1 showing the present invention device.

Referring now to FIG. 2 there is shown a schematic illustration of the present invention magnetic bubble information writing device. In FIG. 2, the reference numeral 20 designates a hairpin-like conductor loop, 21 a permalloy propagation channel which may be a closed loop, 22 and 23 a positive pulse generator and a negative pulse generator respectivily, each being synchronized with an in-plane rotating field, 24 a writing control circuit, 25A, 25B and 25C magnetic bubbles, and 27 the direction of an in-plane rotating field.

The principle of the present invention will be explained in greater detail hereinafter.

Referring to FIG. 2, when a new information "0" is to be written, the conductor loop 20 is connected to the negative side A in the writing control circuit 24 without regarding information to be erased. An electric current passing through the conductor loop 20 is sufficient to annihilate an bubble domain of a magnetic layer layer pattern. In case an bubble domain exists there, it is annihilated. In case there exists no bubble domain, since the electric current produces no bubble domain, there exists no bubble domain after a writing operation. Thus, an information representing "0" is written. To the contrary, when a new information "1" is to be written, the conductor loop 20 is connected to the positive side G in the writing control circuit 24 without regarding information to be erased. An electric current passing through the conductor loop 20 is sufficient to nucleate a bubble domain under a projecting portion of the magnetic layer pattern. In case no bubble exists there, a new bubble domain is nucleated. In case there exists already a bubble domain belonging to the old information to be erased, the old bubble domain prevents nucleation of new one. Thus it is equivalent to writing a new information representing "1". Consequently a new information can be written without any separate step for erasing old information.

Figure 3:
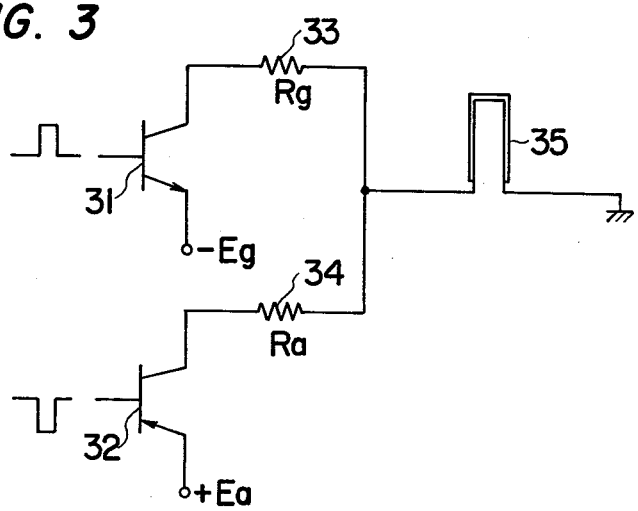
FIG. 3 is a practical circuit diagram of the writing control circuit shown in FIG. 2.

An example of the writing control circuit 24 is shown in FIG. 3. In this figure, reference numerals 31 and 32 designate a PNP and a NPN transistor, respectively, 33 and 34 resistors, 35 a hairpin-like conductor loop. The emitters of the transistor 31 and 32 are connected to power sources, $-Eg$ volts and $+Ea$ volts, respectively. As a positive pulse is applied to the base of the transistor 31, it becomes conductive so that a current $Ig$ (which is equal to $-Eg/Rg$) flows through the conductor loop 35, the resistor 33 and the transistor 31 to the power source $-Eg$. On the other hand, as a negative pulse is applied to the base of the transistor 32, it becomes conductive so that a current $Ia$ (which is equal to $+Ea/Ra$) flows from the power source $+Ea$ through the transistor 32, the resistor 34 and the conductor loop 35 to the ground.

Figure 4:
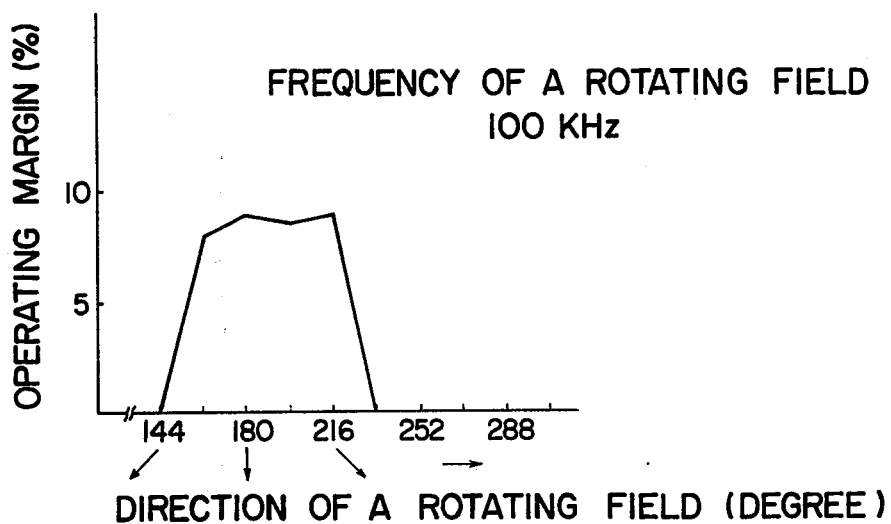
FIG. 4 is a graph exhibiting the relationship between the annihilating operating margin and the direction of the in-plane rotating field in the writing device shown in FIG. 2.

Referring to FIG. 4 there is shown a graph exhibiting the relationship between the annihilating operating margin (the fluctuation tolerance range in a bias field) and the direction of the in-plane rotating field at 100 kHz, in case the conductor loop is disposed on the position shown in FIG. 2 where the ordinate indicates the operating margin, and the abscissa the direction of the rotating field.

As seen from FIG. 4, if the conductor loop is disposed on the position shown in FIG. 2, the operating margin is not so large. However, from the design point of view, the conductor loop cannot be always disposed on the above-mentioned position.

Figure 5:
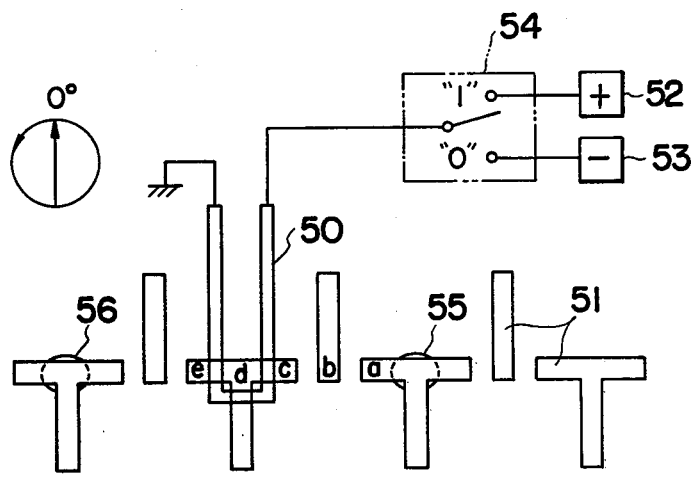
FIG. 5 is a schematic illustration for better understanding of the present invention.
Figure 6:
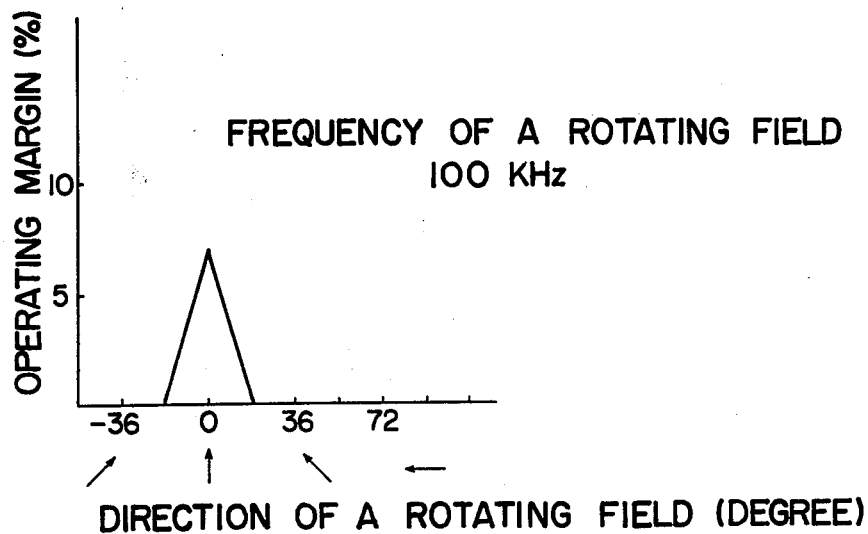
FIG. 6 is a graph similar to that shown in FIG. 4, excepting that it exhibits the operating margin in FIG. 5 device.

FIG. 5 shows a schematic illustration for better understanding of the present invention, in which the conductor loop is disposed at the center of the T pattern. In FIG. 5 the reference numeral 50 designates a hairpin-like conductor loop, 51 a permalloy propagation channel, 52 and 53 a positive pulse generator and a negative pulse generator respectively, 54 a writing control circuit, 55 and 56 magnetic bubbles. The operating margin in this case is shown in FIG. 6. It varies with the timing at which the current is applied, and is maximum when the direction of the rotating field is in the neighborhood of 0°. It is thus necessary from the design point of view that the timing of the current flow into a conductor loop be rigidly determined. Since this fact is very inconvenient in practical operation, a writing device with a broad operating margin is desired.

Figure 7:
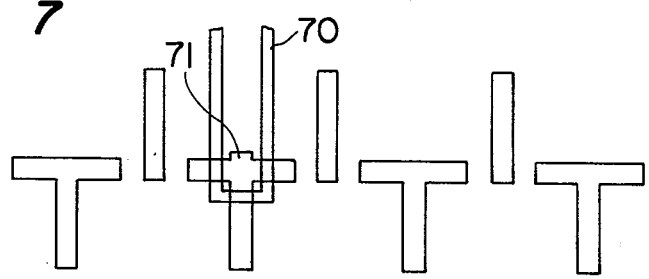
FIGS. 7 - 14 are illustrations for explaining positions where the conductor loop may be disposed.
Figure 8:
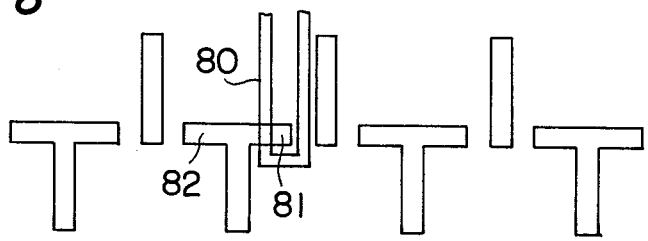
Figure 9:
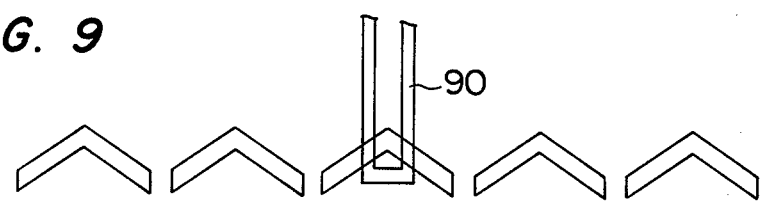
Figure 10:
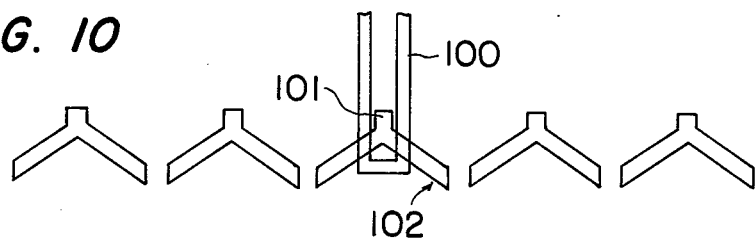
Figure 11:
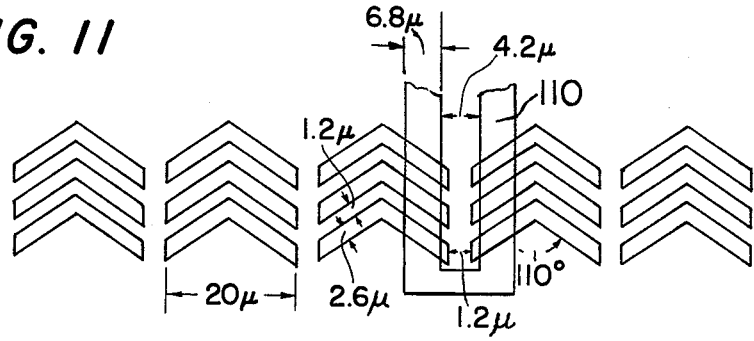
Figure 12:
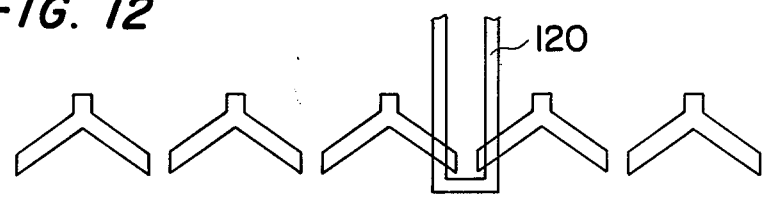
Figure 13:
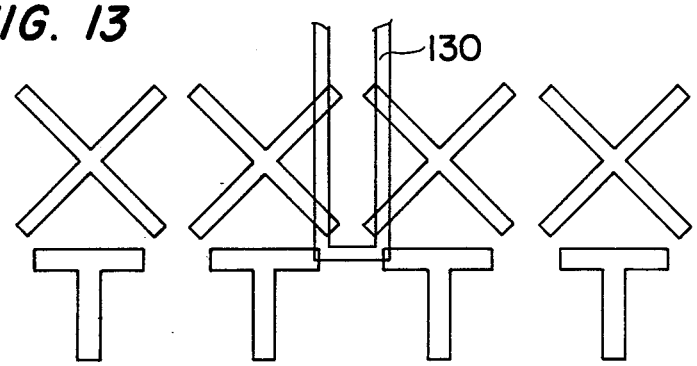
Figure 14:
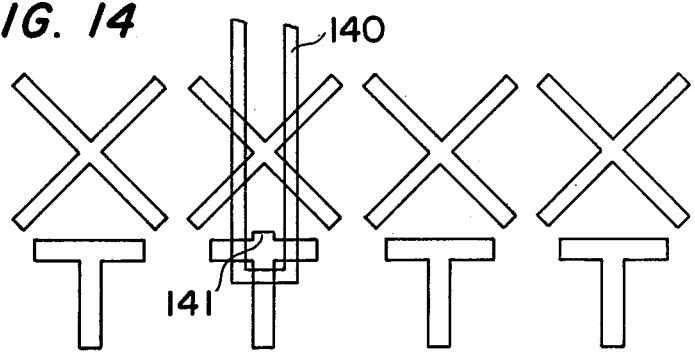

FIGS. 7 – 14 show some examples of positions where a conductor loop may be disposed. FIG. 7 shows a conductor loop 70 disposed on a T pattern with a projecting portion 71 in the center of it, the conductor loop 70 enclosing the projecting portion 71. FIG. 8 shows a conductor loop 80 disposed at one edge 81 of a horizontal bar 82 of a T Pattern. FIG. 9 shows a conductor loop 90 disposed at the top of a chevron pattern. FIG. 10 shows a conductor loop 100 disposed on a pattern 102 with a projecting portion 101 at the top of it, or a Y pattern (which is sometimes called a YY pattern). FIGS. 11 – 13 show a conductor loop disposed over neighboring patterns. In these figures, the reference numerals 110, 120 and 130 designate conductor loops. FIG. 14 shows a conductor loop 140 disposed in the center of the T pattern with a projecting portion 141, the conductor loop enclosing the projecting portion. All the examples shown in FIGS. 7 – 14 are characterized by the fact that the conductor loop is disposed at an edge or projecting portion of a permalloy pattern.

Figure 15:
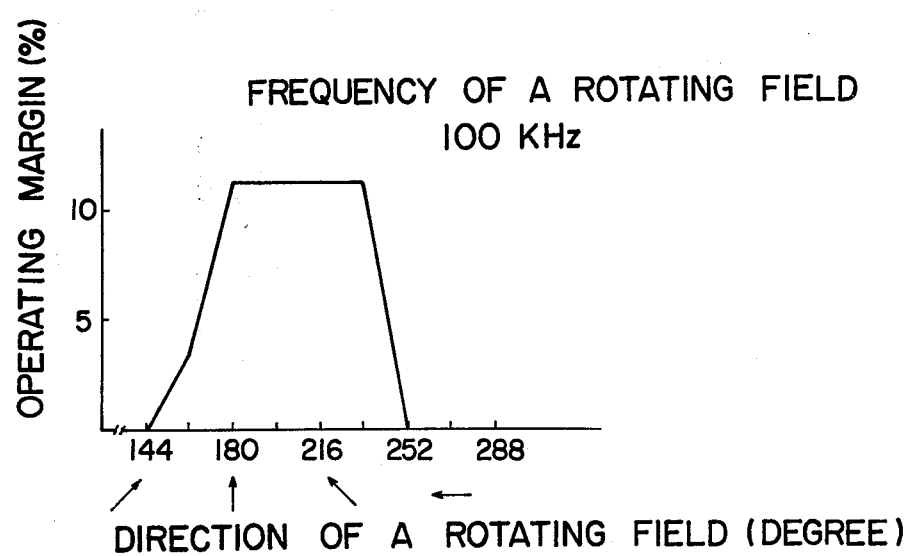
FIG. 15 is a graph similar to FIG. 4, excepting that it exhibits the operating margin in FIG. 11 device.

The operating margin of the example in FIG. 11 is shown in FIG. 15. As seen from this figure, an annihilating operation can be accomplished steadily within a range of about 54°. Of course, the width of the conductor loop should be chosen properly. If it is too small, a bubble is split into two during an annihilating operation. If it is too large, plural bubbles are generated during a generating operation. An example of the width is indicated in FIG. 11. These figures including FIG. 11 are not geometrically exact, but demonstrate only the position of the conductor loop.

Furthermore, we experimented in generating a magnetic bubble, and confirmed that good characteristics were obtained by using a conductor loop.

As discussed above, it is understood that a steady magnetic bubble information writing device with a broad operating margin can be obtained by disposing the conductor loop at a projecting portion of a permalloy pattern. It is not clear why a broad operating margin is obtained by disposing the conductor loop at the above position, but it is thought that a bubble stays therein for a while even if the direction of the rotating field varies a little, because of a magnetic charge density in those portions due to the rotating field.

The hairpin-like conductor loop is preferably disposed on the outside of the closed propagation channel, because the outgoing lines from the conductor loop transverse the closed channel if the conductor loop is disposed on the inside of it.

In addition, the timing at which the writing current is introduced into a conductor loop, is preferably different in phase by 90° from the operating timing of the detector.

What has been described is considered merely illustrative of the principles of this invention. Accordingly, other and various modifications may be made therein by one skilled in the art without departing from the spirit and scope of this invention.

We claim:

1. A magnetic bubble information writing device comprising:
   a sheet of magnetic material in which single wall domains can be propagated, said material having a preferred direction of magnetization substantially normal to the plane of said sheet,
   means for providing a bias field substantially normal to the plane of said sheet,
   magnetic layer patterns adjacent to said sheet for defining a propagation channel for domains in said sheet,
   means for generating a magnetic field rotating through 360 degrees in the plane of said sheet, a single conductor loop disposed on a projecting portion of said magnetic layer patterns, enclosing only said projecting portion, and means for selectively applying without regard to old information a current of a first polarity and a current of a second polarity respectively into the conductor loop when an information "0" and "1" respectively are to be written, whereby said old information can be conformed to new information to be written.

2. A magnetic bubble information writing device according to claim 1, in which the conductor loop encloses only the center of at least one chevron pattern.

3. A magnetic bubble information writing device according to claim 1, in which the conductor loop encloses one edge of an I pattern.

4. A magnetic bubble information writing device according to claim 1, in which the conductor loop encloses the faced edges of adjacent patterns.

5. A magnetic bubble information writing device according to claim 1, in which the conductor loop encloses the center of at least one Y pattern.

6. A magnetic bubble information writing device according to claim 1, in which the magnetic layer patterns form a closed propagation channel, and the conductor loop extends from the outside of the channel to it.

7. A magnetic bubble information writing device according to claim 6, in which the conductor loop encloses one edge of an I pattern.

8. A magnetic bubble information writing device according to claim 6, in which the conductor loop encloses the faced edges of adjacent patterns.

* * * * *